United States Patent [19]
Plants et al.

[11] Patent Number: 5,068,830
[45] Date of Patent: Nov. 26, 1991

[54] HIGH SPEED STATIC RAM SENSING SYSTEM

[75] Inventors: William C. Plants, Santa Clara; Scott N. Fritz, Penn Valley, both of Calif.

[73] Assignee: Advanced Micro Devices, Sunnyvale, Calif.

[21] Appl. No.: 349,564

[22] Filed: May 9, 1989

[51] Int. Cl.$^5$ .................. G11C 11/41; G11C 7/02; G01R 19/00; H03F 3/45
[52] U.S. Cl. ............................. 365/190; 365/207; 365/208; 307/530
[58] Field of Search ............... 365/207, 208, 154, 190; 307/530

[56] References Cited

U.S. PATENT DOCUMENTS

| | | | |
|---|---|---|---|
| 4,536,859 | 8/1985 | Kamuro | 365/154 |
| 4,649,301 | 3/1987 | Van Tran | 307/530 |
| 4,713,797 | 12/1987 | Morton et al. | 365/208 |

Primary Examiner—Stuart N. Hecker
Assistant Examiner—Michael A. Whitfield
Attorney, Agent, or Firm—Townsend and Townsend

[57] ABSTRACT

A current differential sense amplifier for static RAM cells which couple one of a pair of bit lines to a current source for a high speed read operation. The sense amplifier has current mirrors which amplify the current on each of the bit lines. The amplified currents are fed into an active load which has an output node which rises and falls in voltage depending upon the current mismatch. An inverter connected to the output node speeds the slow rate of the node.

20 Claims, 3 Drawing Sheets

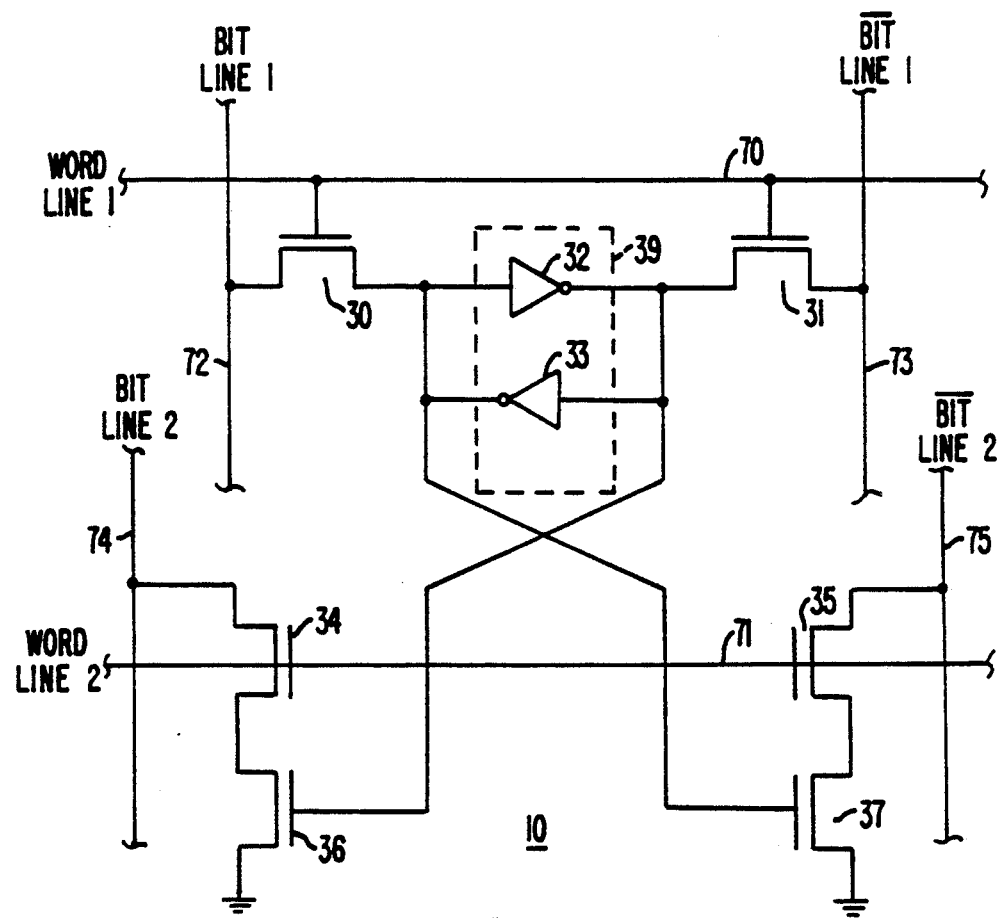
FIG._1.
PRIOR ART
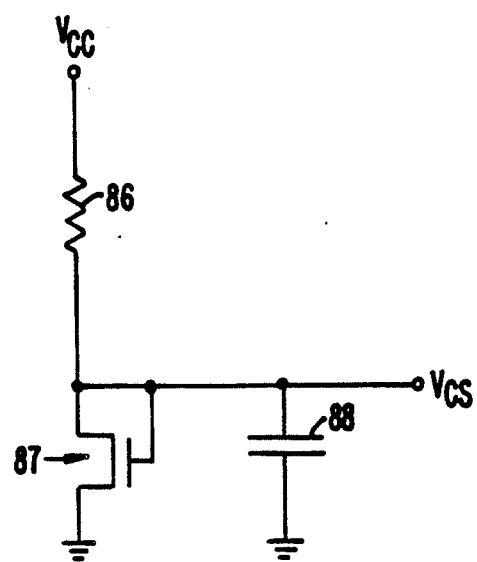
FIG._4.

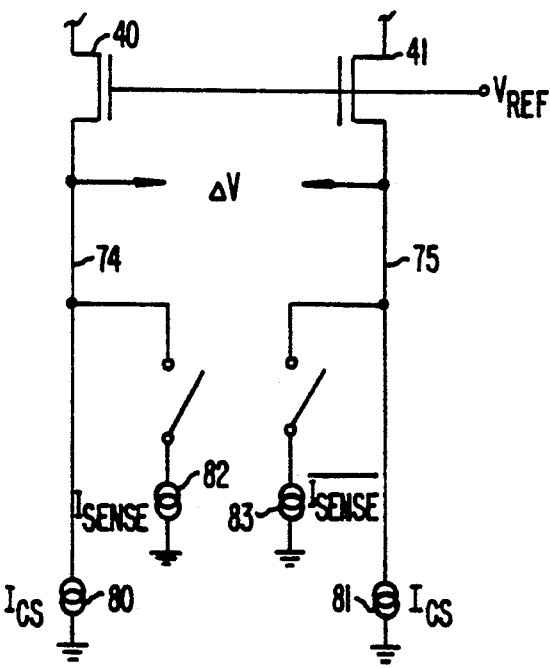
FIG._2A. PRIOR ART
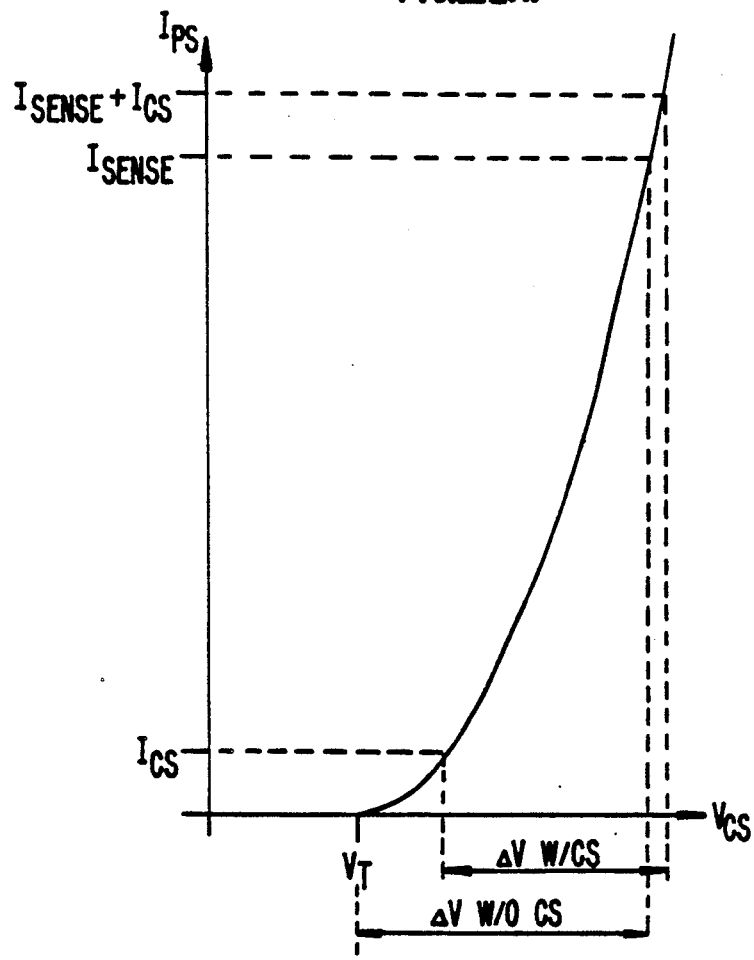
FIG._2B. PRIOR ART

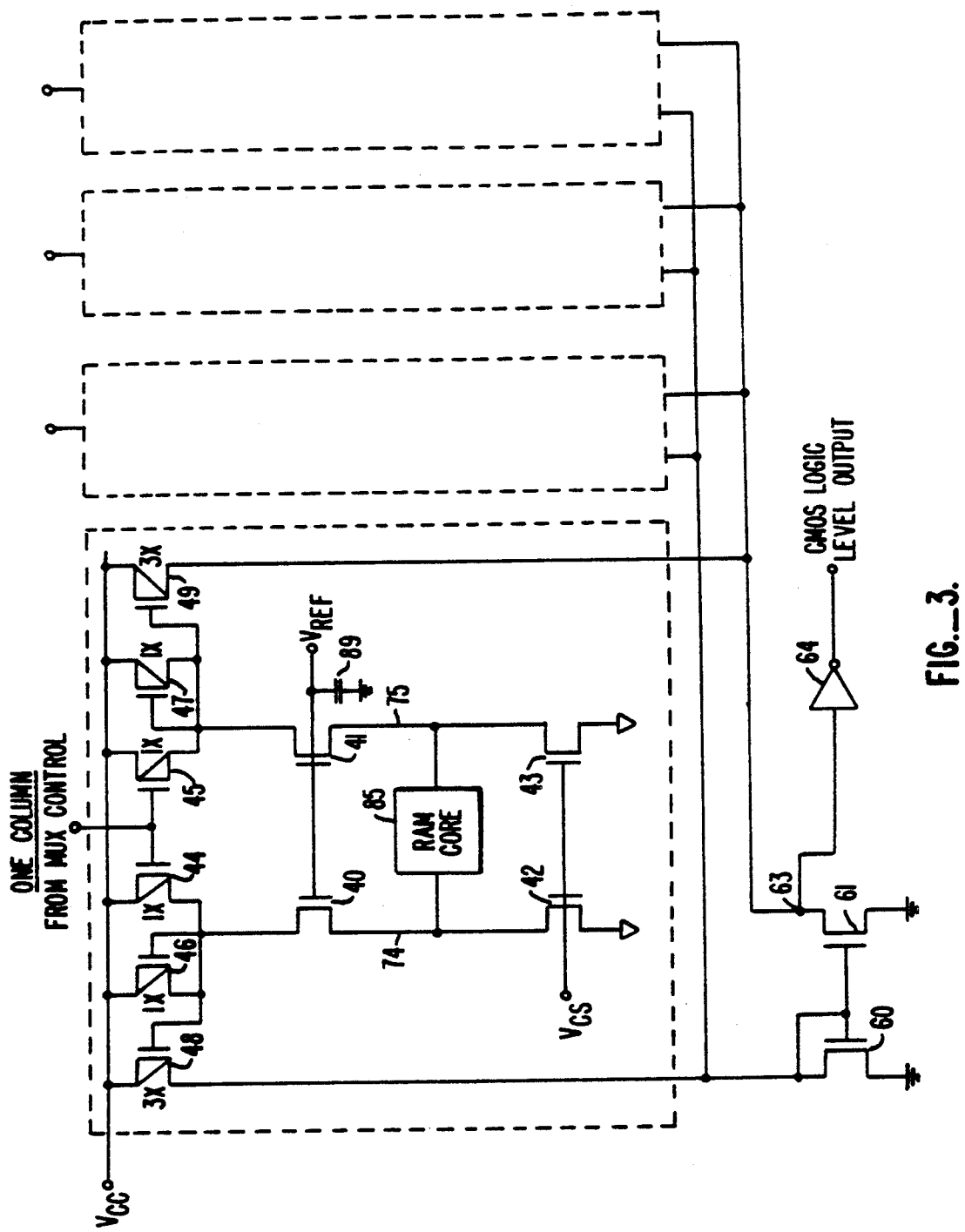
FIG._3.

HIGH SPEED STATIC RAM SENSING SYSTEM

FIELD OF THE INVENTION

The present invention is related to the field of integrated circuit differential sense amplifiers and, more particularly, to CMOS differential current amplifiers.

BACKGROUND OF THE INVENTION

A general rule in integrated circuits is that higher operating speeds require more power. Even in CMOS integrated circuits this is true.

CMOS static RAM integrated circuits typically are arranged in a matrix of rows and columns of memory cells. Words lines extend along the rows of memory cells to access a particular row. Pairs of complementary bit lines extend along the columns of memory cells to read (or write) information from (or to) the accessed memory cell selected by one of the word lines.

In the read operation of one type of CMOS static RAM, one of the differential bit lines which connect a column of memory cells is coupled to a current source by the selected memory cell, while the other bit line is not, for high speed operation. Which bit line is coupled to a current source is determined by the information stored in the selected memory cell.

A problem with high speed operation is that the accessed memory cell causes relatively small signals on the bit lines which operate with small currents and have large capacitances. During a read operation the small signals must converted to the full CMOS logic levels as quickly as possible. However, a mere increase in current is constrained in any design of a high-speed sense amplifier sensing the signals on the bit lines because unrestricted power consumption in integrated circuits is undesirable.

The present invention provides for a sense amplifier which can read that type of memory cell at very high speeds, but at relatively low power.

SUMMARY OF THE INVENTION

The present invention is particularly adapted to an MOS integrated circuit having a column of static RAM cells coupled together by a pair of complementary bit lines with each memory cell when accessed coupling only one of said bit lines to a current source. The state of said memory cell determines which bit line is coupled. A pair of cascode transistors each has its source electrode connected to one of said bit lines.

The present invention provides for a sense amplifier connected to the drain electrode of each cascode transistor. The sense amplifier has a pair of current mirrors, each having an input and output terminal The input terminal of each current mirror is connected to a respective drain electrode of one of the cascode transistors and the output terminal carries a current proportional to the current through the input terminal. An active load is connected to both output terminals of the current mirrors. The active load has an output node responsive to the differences in currents through the output terminals. The output node, connected to the input terminal of an inverter, swings in voltage depending upon current differences. Thus the state of said inverter output terminal is determined by the state of said accessed memory cell.

BRIEF DESCRIPTION OF THE DRAWINGS

FIG. 1 is a circuit diagram of one type of high-speed static RAM cell for which the present invention is suited.

FIG. 2A is a generalized circuit diagram of the static RAM cell of FIG. 1; FIG. 2B is current-voltage graph illustrating the operating characteristics of the cascode transistors connected to a pair of bit lines which are, in turn, connected to the FIG. 1 memory cell.

FIG. 3 is a circuit diagram of the present invention.

FIG. 4 is a circuit diagram of a reference voltage generator used in the present invention.

DETAILED DESCRIPTION OF SPECIFIC EMBODIMENTS

FIG. 1 illustrates a type of static RAM memory cell which can be read at high speeds. The static RAM cell 10 has two pass transistors 30, 31 which are connected a first pair of complementary bit lines 72, 73. The gates of the NMOS transistors 30, 31 are connected to a word line 70. The two transistors 30, 31 are also connected to a latch 39 which is represented by two cross-coupled inverters 32, 33. (The inverters contain complementary PMOS transistors to form a Complementary MOS circuit.) These cross-coupled converters 32, 33 have two stable states, a "1" and a "0" logical state and thus can store the logical state for later access.

This information is accessed or "read" by putting a high signal on the word line 70 so that the pass transistors 30, 31 are turned on so that the bit lines 72,73 are connected to the inverters 32, 33. During this read cycle the voltage of one of the bit lines remains high in its precharged state and the other goes low. This condition sets a sense amplifier into one state or another, which is connected to the bit lines 72, 73.

Similarly, to set the logical state of the inverters 32, 33, the two pass transistors 30, 31 are turned on by a signal on the word line 70. The voltage on one of the bit lines 72, 73 is set high and the other set low to drive or "write" into the memory cell. The latch 39 formed by the inverters 32,33 is set into that logic state.

Four additional transistors 34, 35, 36, and 37 allow a faster read operation of the memory cell by a second set of bit lines 74,75. The NMOS transistors 34, 36 are connected in series with the source electrode of the transistor 36 connected to ground and the drain electrode of the transistor 34 is connected to the bit line 74. The gate electrode of the transistor 36 is connected to the latch 39 of the memory cell, i.e., the output terminal of the inverter 32 and the input terminal of the second inverter 33. The gate electrode of the transistor 34 is connected to a second word line 71.

Similarly the NMOS transistors 35, 37 are series-connected with the source electrode of the transistor 37 connected to ground and the drain electrode of the transistor 35 to the second bit line 75. The gate electrode of the transistor 37 is connected to the latch 39 of the memory cell, i.e., the output terminal of the inverter 3 and the input terminal of the second inverter 32. The gate electrode of the transistor 35 is connected to the second word line 71.

A high-speed read operation is performed by turning on the transistors 34, 35 by a signal on the word line 71. The two bit lines 74, 75 are then respectively connected to the transistors 36, 37 which are, in turn, "on" or "off" in a complementary fashion. The state of the two transistors depends upon the information stored in the latch 39 of the memory cell. If the transistor 35 is on, then the bit line 74 is connected to ground and the transistor 37 is off so that the complementary bit line 75 is unconnected to ground. If the transistor 37 is on, then the bit line 75 is connected to ground instead. In this manner the bit lines 74, 75 provide for a faster access to the state of the memory cell.

FIG. 2A is a generalized view of the memory cell and the bit lines 74, 75. With respect to those bit lines the memory cell in FIG. 1 appears to be a pair of current sources 82, 83, one of which draws a current $I_{SENSE}$ when connected to its respective bit line 74,75. The current source 82 (comprising the transistors 34, 36) is coupled to the bit line 74, while the current source 83 (the transistors 35, 37) is coupled to the bit line 75. Thus, the signal of the word line 71 and the information stored in the latch 39 determines whether one of the current sources 82, 83 is switched on and which one.

FIG. 3 illustrates the present invention. Since the present invention is concerned with the high-speed read operation of the memory cells, FIG. 3 does not show the bit lines 72, 73 and the circuit related to the slower read and write operations of the memory cells, though it would be understood by those skilled in the art that such bit lines 72, 73 and related circuits exist in the complete integrated circuit device.

As is typical in integrated circuit memory devices, the memory cell 10 is replicated in a grid-like array. A large number of memory cells is arranged vertically between the bit lines 74, 75 and each memory cell is connected to the bit lines. The column of memory cells is represented by the RAM core 85. One end of the bit line 74 is connected to a small current source represented by an MOS transistor 42, while the other end of the bit line is connected to a source electrode of an NMOS transistor 40. The complementary bit line 75 is similarly connected at one end to a small current source represented by a transistor 43 and at the other end to a source electrode of the NMOS transistor 41.

The two NMOS transistors 40, 41 act as cascode transistors to isolate the large capacitances associated with each of the bit lines 74, 75 from the much smaller capacitances associated with the sensing circuitry coupled to the drain electrodes of transistors 40, 41. Without such isolation, the read operation of the one of the memory cells in the core 85 becomes much slower and cumbersome.

The gate electrodes of the transistors 40, 41 are held at a reference voltage $V_{REF}$ which ideally should be some interval from the supply voltage $V_{cc}$, such as $V_{cc}/2$. This allows some degree of freedom in the design of the sensing circuitry. A capacitor 89 is also connected to the gate electrodes of the transistors 40,41 to protect $V_{REF}$ from transients on the supply voltage at ground.

A better approach than merely tying the gate electrode to some fraction of the supply voltage is disclosed in a U. S. patent application, U.S. Ser. No. 349,204 entitled "Current Regulator, Threshold Voltage Generator", filed by the assignee and on the same date of the present application. One of the inventors of the present application, William C. Plants, is the inventor of the second application, which is hereby incorporated by reference.

Moreover, to permit the transistors 40, 41 to operate faster, a small current constantly passes through the transistors so that the source-gate voltage swings are reduced as the memory cells in the core 85 are read.

FIG. 2A illustrates the transistors 42, 43 as current sources 80, 81 respectively. As shown in FIG. 2B the operation of each of the cascode transistors 40, 41 is displaced by the small supply current, $I_{CS}$. By increasing the current through the cascode transistors 40, 41, the transistors operate in the steeper portion of the saturation region so that swing in $V_{GS}$ is reduced.

FIG. 4 is a circuit diagram of the circuit used 35 to generate the voltage on the gate electrodes $V_{CS}$ of the transistors 42, 43. An NMOS transistor 87 and a resistor 86 are connected between the supply voltage ($V_{cc}$ is typically +5 volts) and ground. The transistor 87 is in a diode configuration and thus has its gate electrode tied to its drain electrode. The source electrode is tied to ground. The value of the resistor 86 is hundreds of kiloohms so that a small current (actually $I_{CS}$) flows through the resistor and transistor. The gate electrodes of the transistors 42, 43 are connected to the gate electrode of the transistor 87 so that the transistors 42, 43 act as current mirrors of the current flowing through the transistor 87. The capacitor 88 acts as a cushion against fluctuations in the ground voltage.

The present invention uses the change in currents, rather than voltages, through the bit lines 74, 75 as a memory cell in the core 80 is read. This provides for a much faster operation.

The sense amplifier of the present invention has current mirrors connected to each of the drain electrodes of the transistors 40, 41. The drain electrode of the cascode transistor 40 is connected to the drain electrode to a diode-connected PMOS transistor 46, which when in operation provides the current, $I_{CS}$ or $I_{CS}+I_{SENSE}$, to the bit line. In one embodiment of the described circuit implemented in 1.2-micron CMOS technology, $I_{CS}$ is 8–20 microamperes and $I_{SENSE}$ is 150–300 microamperes.

The source electrode of the transistor 46 is connected to the $V_{CC}$ supply. A second PMOS transistor 48 has its source electrode connected to $V_{cc}$ and its gate electrode connected to the gate electrode of the transistor 46. The transistor 48, scaled up by a factor of 3, amplifies the current through the transistor 46. By well-known techniques of integrated circuit design, the physical layout parameters, specifically the channel width, of the transistor 48 are increased over those of the transistor 46. Thus the current through the drain electrode of the transistor 48 is 3 times the current through the drain electrode of the transistor 46.

Likewise, PMOS transistors 47, 49 are connected to the drain electrode of the cascode transistor 41 which couples to the bit line 75.

The drain electrode of the PMOS transistor 48 is connected to a drain and gate electrodes of a diodeconnected NMOS transistor 60 having its source electrode connected to ground. The drain electrode of the PMOS transistor 49 is connected to the drain electrode of an NMOS transistor 61 which also has its source electrode connected to ground. The two transistors 60, 61 are the same size. Their gate electrodes are connected together so that the NMOS transistor 61 tries to conduct as much current as the transistor 60 does.

Operationally the two transistors 60, 61 form a current mirror which acts as an active load. The mismatches between the currents through the two transistors 49, 61 result in voltage swings in an output node 63. For example, if the transistors 48 and 60 carry the larger current (3 times $I_{CS}+I_{SENSE}$), the transistor 61 tries to follow. However, the transistor 49 is providing a much smaller current (3 times $I_{CS}$) to the transistor 61. Thus the capacitance associated with the node 63 formed by drain electrode of the transistor 61 and the drain electrode 49 must supply the current to the transistor 61. The node voltage falls rapidly until the node is very near ground and the transistor 61 is in the linear mode.

On the other hand, if the transistor 49 is conducting the larger current and the transistor 48 the smaller, the transistor 61 in trying to follow the transistor 60 cannot accept the large current. Hence the node capacitance is charged and the node voltage goes high near to $V_{CC}$. Then the transistor 49 goes into the linear mode and stops tracking the current through the transistor 47.

An input terminal of an inverter 64 is connected to the node 63 formed by the drain electrodes of the transistors 49 and 61. Although the voltage on the node 63 can swing from near ground to near $V_{CC}$, the slew rate may be slower than desired. The inverter 64 translates the voltage swings of the node 63 into full CMOS logic levels while isolating the node 63 from any additional capacitance associated with the output node of the inverter 64. Thus the completion of the sensing operation is accelerated.

A further aspect of the present invention is that typically static RAMs are laid out so that several columns of memory cells are laid out horizontally next to each other. As explained above, vertical bit line pairs are associated with each column. There are also horizontal word lines across the columns to access the memory cells in the columns so that a signal on a word line accesses memory cells in different columns.

Conventionally load devices are placed in the path of the currents on the bit lines to generate an output voltage differential for each bit line pair. Pass transistors are placed on the voltage output nodes associated with each line of the bit line pair. The pass transistors are connected in parallel to some output sense circuit. A multiplexer controller selects only one pair of pass transistors at a time so that only one column is accessed at a time. Thus only one memory cell in the columns is accessed at one time.

The problem with this type of arrangement is that pass transistors add delay to the sense time because of the time necessary for the signals to propagate through them. Thus the multiplexing arrangement slows the static RAM operation.

The present invention also has a multiplexing operation so that only one of a column of memory cells is accessed at a time. However, since current is used instead of voltage, the read operation is much faster than with conventional multiplexing techniques.

FIG. 3 shows four columns of memory cells represented by RAM core 85 connected to the active load transistors 60, 61 and the inverter 64. Connected to the gate electrode of each PMOS transistor 46, 47 associated with each bit line pair 74, 75 are PMOS transistors 44, 45 which act as current switches. When turned on, these transistors 44, 45 steal current from the transistors 46, 47 so that these transistors 46, 47 do not conduct current. The gate electrode of each transistor 44, 45 is connected to the multiplexer control (not shown). When a particular column of memory cells is not selected, the output signal from the multiplexer turns on that pair of transistors 44, 45. Thus transistors 46 and 47 are non-conducting and so are transistors 48 and 49. When the column is selected, the transistors 44, 45 are turned off by the multiplexer control. The PMOS 46 and 47 become operational and the gained current mirror transistors 48, 49 are also operational. The selected column affects the voltage at the node 63.

Thus this technique is inherently faster than voltage sensing. The transistors 44, 45 turn on and off simultaneously with the turn on of the transistors 34, 35 in the memory cell. Thus the multiplexer selection is performed in parallel with the core memory cell. No additional delay is added in series with the sense path.

While the description above provides a full and complete disclosure of the preferred embodiments of the present invention, various modifications, alternate constructions and equivalents may be employed without departing from the true scope and spirit of the invention. For example, the circuits of the inventions may be designed in BiCMOS technology, rather than CMOS. Therefore, the present invention should be limited only by the metes and bounds of the appended claims.

What is claimed is:

1. A static RAM sensing system comprising
a column of static RAM cells coupled together by a pair of complementary bit lines, each memory cell when accessed coupling only one of said pair of complementary bit lines to a current source, each state of said memory cell determining which bit line is coupled;
a pair of cascode transistors, each having first and second source/drain electrodes and a gate electrode, said first source/drain electrode connected to one of said pair of complementary bit lines;
a pair of current mirrors, each having an input and output terminal, said input terminal of each current mirror connected to a respective second source/drain electrode of said air of cascode transistors, said output terminal carrying a current proportional to a current through said input terminal;
an active load connected to both output terminals of said pair of current mirrors, said active load having an output node responsive to differences in currents through said output terminals; and
an inverter having an inverter input terminal and an inverter output terminal, said inverter input terminal connected to said output node;
whereby the state of said inverter output terminal is determined by the state of an accessed memory cell.

2. The static RAM sensing system as in claim 1 wherein said active load comprises
a first transistor in diode configuration having first and second source/drain electrodes and a gate electrode, said first source/drain electrode of said first transistor connected to the output terminal of one of said pair of current mirrors;
a second transistor having first and second source/drain electrodes and a gate electrode, said gate electrode of said second transistor connected to said gate electrode of said first transistor, said first source/drain electrode of said second transistor connected to the output terminal of the other of said pair of current mirrors and forming said output node.

3. The sensing system as in claim 2 wherein said pair of cascode transistors, first and second transistors are transistors of a first polarity and said pair of current mirrors comprise transistors of a second polarity.

4. The sensing system as in claim 3 wherein said first polarity transistors are NMOS transistors and said second polarity transistors are PMOS transistors.

5. The sensing system as in claim 1 wherein said currents through said input terminals are amplified by a predetermined factor for a gain in currents through said current mirror output terminals.

6. An MOS integrated circuit comprising
   a plurality of static RAM cells arranged in rows and columns, each column of static RAM cells coupled together by a pair of complementary bit lines, each memory cell when selected coupling only one of said pair of complementary bit lines to a current source, each state of said memory cell determining which bit line is coupled;
   a pair of cascode transistors, each having first and second source/drain electrodes and a gate electrode, said first source/drain electrode connected to one of said pair of complementary bit lines,
   a pair of current mirrors, each having an input and output terminal, said input terminal of each current mirror connected to a respective source/drain electrode of said pair of cascode transistors, said output terminal carrying a current proportional to a current through said input terminal;
   an active load connected to both output terminals of said pair of current mirrors, said active load having an output mode responsive to differences in currents through said output terminals; and
   an inverter having an inverter input terminal and an inverter output terminal, said inverter input terminal connected to said output node,
   whereby the state of said inverter output terminal is determined by the state of an accessed memory cell.

7. In an integrated circuit having a plurality of static RAM memory cells arranged in at least one column, a sensing system for sensing a state of a selected memory cell comprising
   a pair of complementary bit lines, each complementary bit line pair associated with a column of said memory cells;
   each memory cell having a pair of memory cell current sources, each memory cell when selected coupling each complementary bit line of said complementary bit line pair to one memory cell current source of said memory cell current source pair, each state of said memory cell determining which one memory cell current source of said memory cell current source pair is switched on;
   a pair of current sources, each current source respectively connected to one complementary bit line of said complementary bit line pair, each current source drawing a constant current through said one complementary bit line of said complementary bit line pair;
   a pair of cascode transistors, each having first and second source/drain electrodes and a gate electrode, said first source/drain electrode connected to one complementary bit line of said complementary bit line pair;
   a pair of current mirrors, each having an input and output terminal, said input terminal of each current mirror connected to a respective source/drain electrode of said cascode transistors, said output terminal of each current mirror carrying a current proportional to a current through said input terminal of each current mirror;
   an active load connected to both output terminals of said pair of current mirrors, said active load having an output node responsive to differences in currents through said output terminals by voltage swings at said output node; and
   accelerating means having an input terminal and an output terminal, said input terminal connected to said output node, for accelerating said voltage swings at said output node into full voltage logic levels at said output terminal;
   whereby the state of said output terminal of said accelerating means is determined by a state of said selected memory cell.

8. The sensing system of claim 7 wherein said accelerating means comprises an inverter.

9. The sensing system as in claim 7 wherein said active load comprises
   a first transistor in diode configuration having first and second source/drain electrodes and a gate electrode, said first source/drain electrode of said first transistor connected to an output terminal of one current mirror of said current mirror pair;
   a second transistor having first and second source/drain electrodes and a gate electrode, said gate electrode of said second transistor connected to said gate electrode of said first transistor, said first source/drain electrode of said second transistor connected to an output terminal of the other of said current mirror pair and forming said output node.

10. The sensing system as in claim 9 wherein said pair of cascode transistors, first and second transistors are transistors of a first polarity and said pair current mirrors comprise transistors of a second polarity.

11. The sensing system as in claim 7 wherein said static RAM cells are arranged in more than one column and said pair of complementary bit lines, current sources, cascode transistors, current mirrors are each associated with a column of memory cells, a memory cell selected by its column and row, and further comprising
   pairs of switches, each switch pair associated with a current mirror pair, each switch of each switch pair respectively connected to an input terminal of one current mirror of said current mirror pair associated with said switch pair, said switch disabling said one current mirror when said column associated with said switch is not selected and enabling said one current mirror to selected said column of memory cells.

12. In an integrated circuit having a plurality of static RAM cells arranged in columns and rows, a memory cell selected by its column and row, a pair of complementary bit lines associated with each column of memory cells, each memory cell when selected coupling only one of said bit lines to a current source, each state of said memory cell determining which bit line is coupled, a system for sensing the state of a selected memory cell comprising
   a plurality of cascode transistor pairs, each cascode transistor pair associated with a complementary bit line pair, each cascode transistor of a cascode transistor pair having first and second source/drain electrodes and a gate electrode, said first source/drain electrode respectively connected to one complementary bit line of said complementary bit line pair;
   a plurality of pairs of current mirrors, each current mirror pair associated with a cascode transistor pair and complementary bit line pair, each current mirror having an input and output terminal, said input terminal of each current mirror connected to a respective source/drain electrode of one cascode transistor of said cascode transistor pair, said output terminal carrying a current proportional to a current though said input terminal;

a plurality of switch pairs, each switch pair associated with a current mirror pair, each switch of said switch pair respectively connected to an input terminal of one current mirror of said current mirror pair of said current mirror pair, said switch disabling said one current mirror of said current mirror pair when said column associated with said switch is not selected and enabling said one current mirror of said current mirror pair when said column is selected;

an active load connected to both output terminals of all of said current mirror pairs, said active load having an output node responsive to differences in currents through said output terminals; and accelerating means connected to said output mode for accelerating voltage swings at said output node into full logic voltage levels;

whereby a column and a row of a selected memory cell may be selected simultaneously for quickly sensing the state of said selected memory cell.

13. The sensing system as in claim 12 wherein said active load comprises
    a first transistor in diode configuration having first and second source/drain electrodes and a gate electrode, said first source/drain electrode of said first transistor connected to the output terminal of one of said current mirrors;
    a second transistor having first and second source/drain electrodes and a gate electrode, said gate electrode of said second transistor connected to said gate electrode of said first transistor, said first source/drain electrode of said second transistor connected to the output terminal of the other of said current mirrors and forming said output node.

14. The sensing system as in claim 13 wherein said pair of cascode transistors, first and second transistors are transistors of a first polarity and said pair of current mirrors comprise transistors of a second polarity.

15. The sensing system as in claim 14 wherein said first polarity transistors are NMOS transistors and said second polarity transistors are PMOS transistors.

16. The sensing system as in claim 12 wherein said current through said input terminal of each current mirror is amplified by a predetermined factor for a gain in current through said output terminal of said current mirror.

17. The sensing system as in claim 12 wherein each current mirror of said current mirror pairs further comprises
    a third transistor in diode configuration having first and second source/drain electrodes and a gate electrode, said first source/drain electrode of said third transistor connected to said input terminal of said current mirror;
    a fourth transistor having first and second source/drain electrodes and a gate electrode, said gate electrode of said fourth transistor connected to said gate electrode of said third transistor, said first source/drain electrode connected to said output terminal of said current mirror; and
    wherein said each of said switches further comprises a current source having a terminal connected to said input terminal of said current mirror, said current source not supplying current to said input terminal to enable said third and fourth transistors to select the column of said selected memory cell.

18. The sensing system as in claim 17 wherein said current source comprises
    a fifth transistor having first and second source/drain electrodes and a gate electrode, said gate electrode of said fifth transistor connected to a multiplexer control for selecting a column of memory cells, said first source/drain electrode of said fifth transistor connected to said input terminal.

19. The sensing system as in claim 12 further comprising
    a plurality of pairs of current sources, each current source pair associated with a complementary bit line pair and each current source of a pair of current sources respectively connected to one of associated said complementary bit line pair, each current source drawing a constant current through the associated one of said pair of transistors, first and second transistors are transistors of a first polarity and said pair of current mirrors comprise transistors of a second polarity.

20. The sensing system as in claim 12 wherein said accelerating means comprises an inverter.

* * * * *